US012749546B2

(12) United States Patent
Niikura et al.

(10) Patent No.: US 12,749,546 B2
(45) Date of Patent: Sep. 29, 2026

(54) MEMORY SYSTEM AND CONTROL METHOD THEREOF

(71) Applicant: Kioxia Corporation, Tokyo (JP)

(72) Inventors: Hisaki Niikura, Tokyo (JP); Yasuyuki Ushijima, Yokohama Kanagawa (JP); Eriko Akaihata, Yashio Saitama (JP)

(73) Assignee: Kioxia Corporation, Tokyo (JP)

( * ) Notice: Subject to any disclaimer, the term of this patent is extended or adjusted under 35 U.S.C. 154(b) by 185 days.

(21) Appl. No.: 18/798,155

(22) Filed: Aug. 8, 2024

(65) Prior Publication Data

US 2025/0087284 A1 Mar. 13, 2025

(30) Foreign Application Priority Data

Sep. 13, 2023 (JP) ................................ 2023-148724

(51) Int. Cl.

*G11C 16/26* (2006.01)
*G11C 16/10* (2006.01)
*G11C 16/34* (2006.01)
*G11C 29/52* (2006.01)

(52) U.S. Cl.

CPC ........ *G11C 16/3459* (2013.01); *G11C 16/102* (2013.01); *G11C 16/26* (2013.01); *G11C 29/52* (2013.01)

(58) Field of Classification Search

CPC ... G11C 16/3459; G11C 16/102; G11C 16/26; G11C 29/52; G11C 11/5628; G11C 11/5642; G11C 16/0483; G11C 29/028; G11C 29/42; G06F 3/0658; G06F 3/064; G06F 3/0644; G06F 3/0652; G06F 3/0653; G06F 3/0673; G06F 11/1008

USPC ..................................................... 365/185.22

See application file for complete search history.

(56) References Cited

U.S. PATENT DOCUMENTS

| | | | | |
|---|---|---|---|---|
| 7,808,819 | B2 | 10/2010 | Murin et al. | |
| 8,995,197 | B1 | 3/2015 | Steiner et al. | |
| 2019/0088314 | A1* | 3/2019 | Sato | G11C 29/028 |
| 2020/0192759 | A1* | 6/2020 | Hwang | G06F 11/1048 |
| 2021/0143821 | A1 | 5/2021 | Tzafrir et al. | |
| 2022/0093182 | A1* | 3/2022 | Kuribara | G06F 3/0619 |
| 2022/0208294 | A1* | 6/2022 | Lee | G11C 11/5671 |
| 2023/0307061 | A1 | 9/2023 | Konishi et al. | |

FOREIGN PATENT DOCUMENTS

| | | | |
|---|---|---|---|
| JP | 2006-185483 | A | 7/2006 |
| JP | 2007-193885 | A | 8/2007 |
| JP | 5410507 | B2 | 2/2014 |
| TW | 202316440 | A | 4/2023 |

* cited by examiner

*Primary Examiner* — Amir Zarabian

(74) *Attorney, Agent, or Firm* — Kim & Stewart LLP

(57) ABSTRACT

A memory system includes a memory device including a plurality of memory cell transistors, and a memory controller. The memory controller is configured to write data to each of the plurality of memory cell transistors, the data having one of a plurality of bit values, read the data from the plurality of memory cell transistors, and measure a number of errors included in the read data with respect to two of the bit values of which corresponding threshold voltage distributions are adjacent to each other. The memory controller is further configured to adjust a difference between the threshold voltage distributions corresponding to the two of the bit values based on the measured number of errors.

20 Claims, 20 Drawing Sheets

FIG. 10

61

| NUMBER OF ERROR BITS [bit/4KB] | ADJUSTMENT AMOUNT Δ OF WRITE DISTRIBUTION INTERVAL |
|---|---|
| $FBC_A \geqq 20$ | $\Delta VCG_A = +0.01$ |
| $FBC_A \geqq 50$ | $\Delta VCG_A = +0.02$ |
| $FBC_A \geqq 100$ | $\Delta VCG_A = +0.03$ |
| $FBC_A \geqq 150$ | $\Delta VCG_A = +0.05$ |
| $FBC_A < 10$ | $\Delta VCG_A = -0.01$ |
| ... (OMITTED) | ... (OMITTED) |
| $FBC_B \geqq 10$ | $\Delta VCG_B = +0.01$ |
| $FBC_B \geqq 20$ | $\Delta VCG_B = +0.02$ |
| $FBC_B \geqq 40$ | $\Delta VCG_B = +0.03$ |
| ... (OMITTED) | ... (OMITTED) |
| $FBC_G \geqq 10$ | $\Delta VCG_G = +0.01$ |
| $FBC_G \geqq 20$ | $\Delta VCG_G = +0.02$ |
| $FBC_G \geqq 50$ | $\Delta VCG_G = +0.03$ |
| $FBC_G < 5$ | $\Delta VCG_G = -0.01$ |

FIG. 13

62

| POSITION OF Die | Block | WL | ADJUSTMENT AMOUNT Δ OF DISTRIBUTION INTERVAL FOR EACH STATE |
|---|---|---|---|
| ch=0, ce=1, lun=0 | 2010 | * | $(\Delta VCG_A, \Delta VCG_B, \ldots, \Delta VCG_G) = (+0.01, +0.02, \ldots, -0.01)$ |
| ch=0, ce=1, lun=0 | 3673 | 54-57 | $(\Delta VCG_A, \Delta VCG_B, \ldots, \Delta VCG_G) = (+0.02, +0.05, \ldots, +0.01)$ |
| ch=1, ce=1, lun=0 | * | * | $(\Delta VCG_A, \Delta VCG_B, \ldots, \Delta VCG_G) = (-0.02, +0.01, \ldots, +0.05)$ |
| ch=0, ce=0, lun=1 | * | 15-27 | $(\Delta VCG_A, \Delta VCG_B, \ldots, \Delta VCG_G) = (-0.01, -0.01, \ldots, -0.01)$ |
| ch=0, ce=0, lun=1 | * | 48-53 | $(\Delta VCG_A, \Delta VCG_B, \ldots, \Delta VCG_G) = (+0.01, +0.01, \ldots, +0.01)$ |
| ch=0, ce=0, lun=1 | * | 54-58 | $(\Delta VCG_A, \Delta VCG_B, \ldots, \Delta VCG_G) = (+0.02, +0.01, \ldots, +0.05)$ |
| ch=0, ce=0, lun=1 | 1096 | * | $(\Delta VCG_A, \Delta VCG_B, \ldots, \Delta VCG_G) = (+0.05, -0.02, \ldots, +0.01)$ |
| … | … | … | … |

*FIG. 18*

62

| | Die (POSITION) | Block | WL | ADJUSTMENT AMOUNT Δ OF DISTRIBUTION INTERVAL FOR EACH STATE |
|---|---|---|---|---|
| Die0 | ch=0, ce=0, lun=0 | * | 0-12 | $(\Delta VCG_A, \Delta VCG_B, \ldots, \Delta VCG_G) = (+0.01, +0.02, \ldots, -0.01)$ |
| Die0 | ch=0, ce=0, lun=0 | * | 13-36 | $(\Delta VCG_A, \Delta VCG_B, \ldots, \Delta VCG_G) = (+0.02, +0.05, \ldots, +0.01)$ |
| Die0 | … | … | … | … |
| Die0 | ch=0, ce=0, lun=0 | * | 110-111 | $(\Delta VCG_A, \Delta VCG_B, \ldots, \Delta VCG_G) = (-0.01, -0.01, \ldots, -0.01)$ |
| Die1 | ch=0, ce=1, lun=0 | * | 0-15 | $(\Delta VCG_A, \Delta VCG_B, \ldots, \Delta VCG_G) = (+0.01, +0.01, \ldots, +0.01)$ |
| Die1 | ch=0, ce=1, lun=0 | * | 16-25 | $(\Delta VCG_A, \Delta VCG_B, \ldots, \Delta VCG_G) = (+0.02, +0.01, \ldots, +0.05)$ |
| | … | … | … | … |

MEMORY SYSTEM AND CONTROL METHOD THEREOF

CROSS-REFERENCE TO RELATED APPLICATION

This application is based upon and claims the benefit of priority from Japanese Patent Application No. 2023-148724, filed Sep. 13, 2023, the entire contents of which are incorporated herein by reference.

FIELD

Embodiments described herein relate generally to a memory system and a control method thereof.

BACKGROUND

A storage apparatus includes a memory device including a plurality of memory cell transistors. In recent years, as the capacity of a storage apparatus increases, the amount of data that can be stored in one memory cell transistor is increased due to multi-valuation. Examples of the multi-valuation include data storage using a quad-level cell (QLC). However, in the QLC, a threshold voltage of each memory cell transistor after writing goes into one of 16 values, resulting in narrower ranges of threshold voltage distributions. A decrease in reliability is a problem due to a change in the threshold voltages of the memory cell transistors.

BRIEF DESCRIPTION OF THE DRAWINGS

FIG. 10 is a diagram showing a content of a parameter list according to the first embodiment.

FIG. 13 is a diagram showing a content of a setting table according to the first embodiment.

FIG. 18 is a diagram showing a content of a setting table according to the second embodiment.

DETAILED DESCRIPTION

Figure 1:
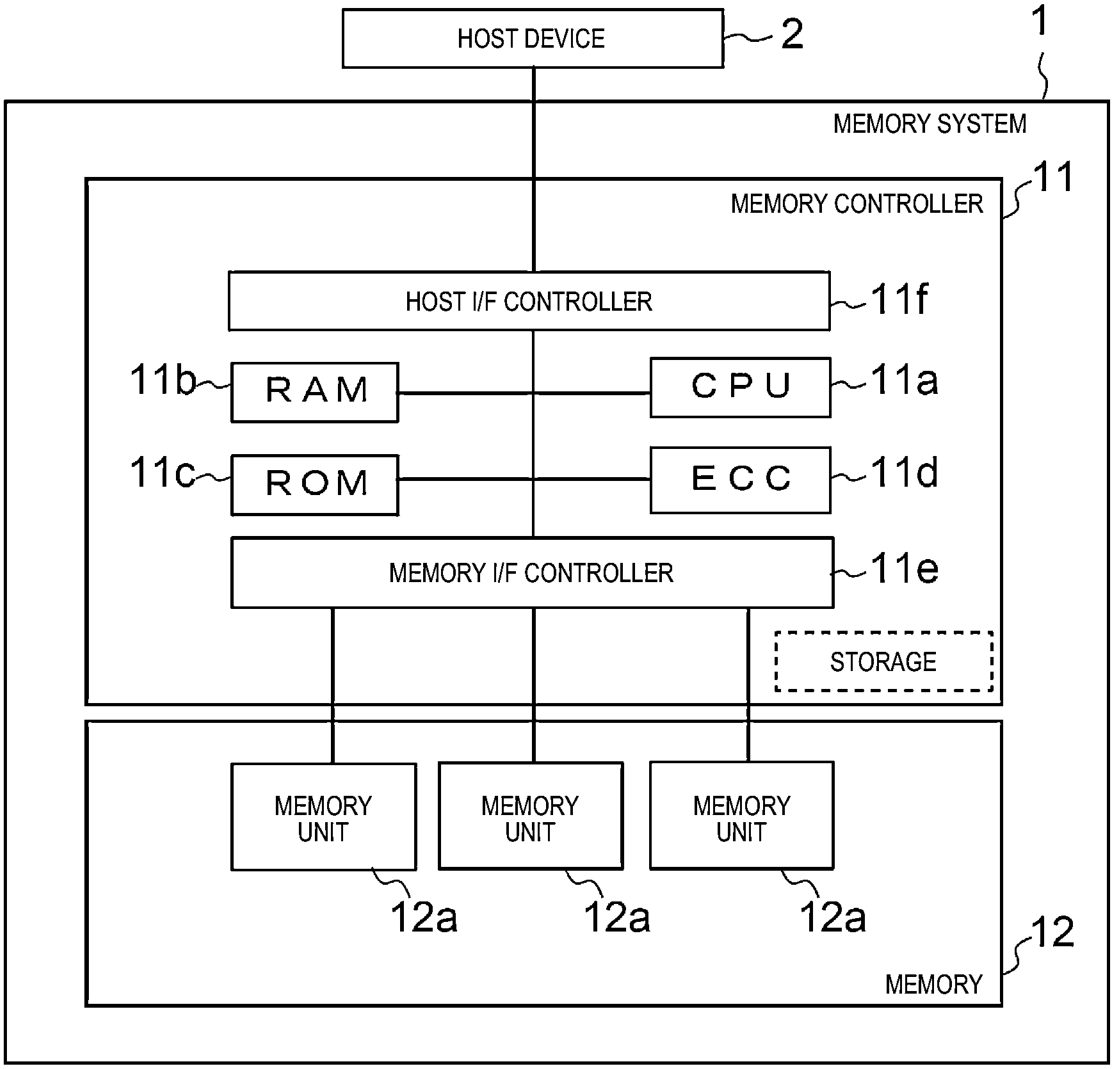
FIG. 1 is a block diagram showing a configuration of an information processing system according to a first embodiment.

Embodiments provide a memory system and a control method thereof, which can improve reliability.

In general, according to an embodiment, a memory system includes a memory device including a plurality of memory cell transistors, and a memory controller. The memory controller is configured to write data to each of the plurality of memory cell transistors, the data having one of a plurality of bit values, read the data from the plurality of memory cell transistors, and measure a number of errors included in the read data with respect to two of the bit values of which corresponding threshold voltage distributions are adjacent to each other. The memory controller is further configured to adjust a difference between the threshold voltage distributions corresponding to the two of the bit values based on the measured number of errors.

Hereinafter, embodiments of the present disclosure will be described with reference to the drawings. In the specification and drawings, the same elements are denoted by the same reference numerals.

First Embodiment

FIG. 1 is a block diagram showing a configuration of an information processing system according to a first embodiment.

The information processing system according to the first embodiment includes a memory system 1 and a host device 2. The memory system 1 is, for example, a memory card, a universal flash storage (UFS), or a solid state drive (SSD). The memory system 1 functions, for example, as an external storage device for the host device 2. The host device 2 is an information processing device. The host device 2 is, for example, a personal computer, a server device, or a mobile device. The host device 2 may issue an access request (read request, write (program) request, and erase request) to the memory system 1.

The memory system 1 includes a memory controller 11 and a memory 12.

The memory controller 11 is a semiconductor device that controls the memory 12. The memory controller 11 controls various operations of the memory system 1. For example, the memory controller 11 controls reading of data from the memory 12 based on the received read request. The memory controller 11 also controls writing of data to the memory 12 based on the received write request. The memory controller

11 also controls erasing of data from the memory 12 based on the received erase request.

The memory 12 (hereinafter may be referred to as memory device) includes a plurality of memory cell transistors (hereinafter may be referred to as memory cells). The memory 12 is, for example, a multi-level memory. The multi-level memory is a memory in which more than two types of values can be stored in each memory cell. For example, when the memory 12 is a 16-level memory, each memory cell can store 16 types of values. The 16 types of values include, for example, values from 0 to 15 (0000 to 1111 in binary). Alternatively, the memory 12 may be, for example, a binary memory. The binary memory is a memory in which two types of values can be stored in each memory cell.

The memory controller 11 includes a central processing unit (CPU) 11*a*, a random access memory (RAM) 11*b*, a read only memory (ROM) 11*c*, an error correcting code (ECC) circuit 11*d*, a memory interface (I/F) controller 11*e*, and a host I/F controller 11*f*. The memory controller 11 may further include a storage in which software is stored.

The CPU 11*a* is a processor that executes various programs.

The RAM 11*b* is a volatile memory capable of reading and writing data. The RAM 11*b* provides a work area for the CPU 11*a*.

The ROM 11*c* is a memory from which data can be read. The ROM 11*c* stores various types of data necessary for an operation of the CPU 11*a*.

The ECC circuit 11*d* is a circuit that performs processing related to error correction. The ECC circuit 11*d* performs encoding of write data when the write data is written to the memory 12. Encoding of the write data includes to add an error correction code to the write data. The ECC circuit 11*d* further corrects an error included in read data based on error correction code for the read data when the read data is read from the memory 12.

The memory I/F controller 11*e* is a circuit that manages an interface between the memory controller 11 and the memory 12. The memory I/F controller 11*e* controls data transfer between the memory controller 11 and the memory 12 under control of the CPU 11*a*.

The host I/F controller 11*f* is a circuit that manages an interface between the memory controller 11 and the host device 2. The host I/F controller 11*f* controls data transfer between the memory controller 11 and the host device 2 under control of the CPU 11*a*.

The memory 12 includes one or a plurality of memory units 12*a*. FIG. 1 shows a case where the memory 12 includes three memory units 12*a* as an example. The memory unit 12*a* is a memory chip or a memory die. Each memory unit 12*a* has a memory cell array including a plurality of memory cells. The memory cell array functions as a memory region capable of storing data. Details of the memory cell array will be described below. The memory 12 is, for example, a NAND type flash memory.

Figure 2:
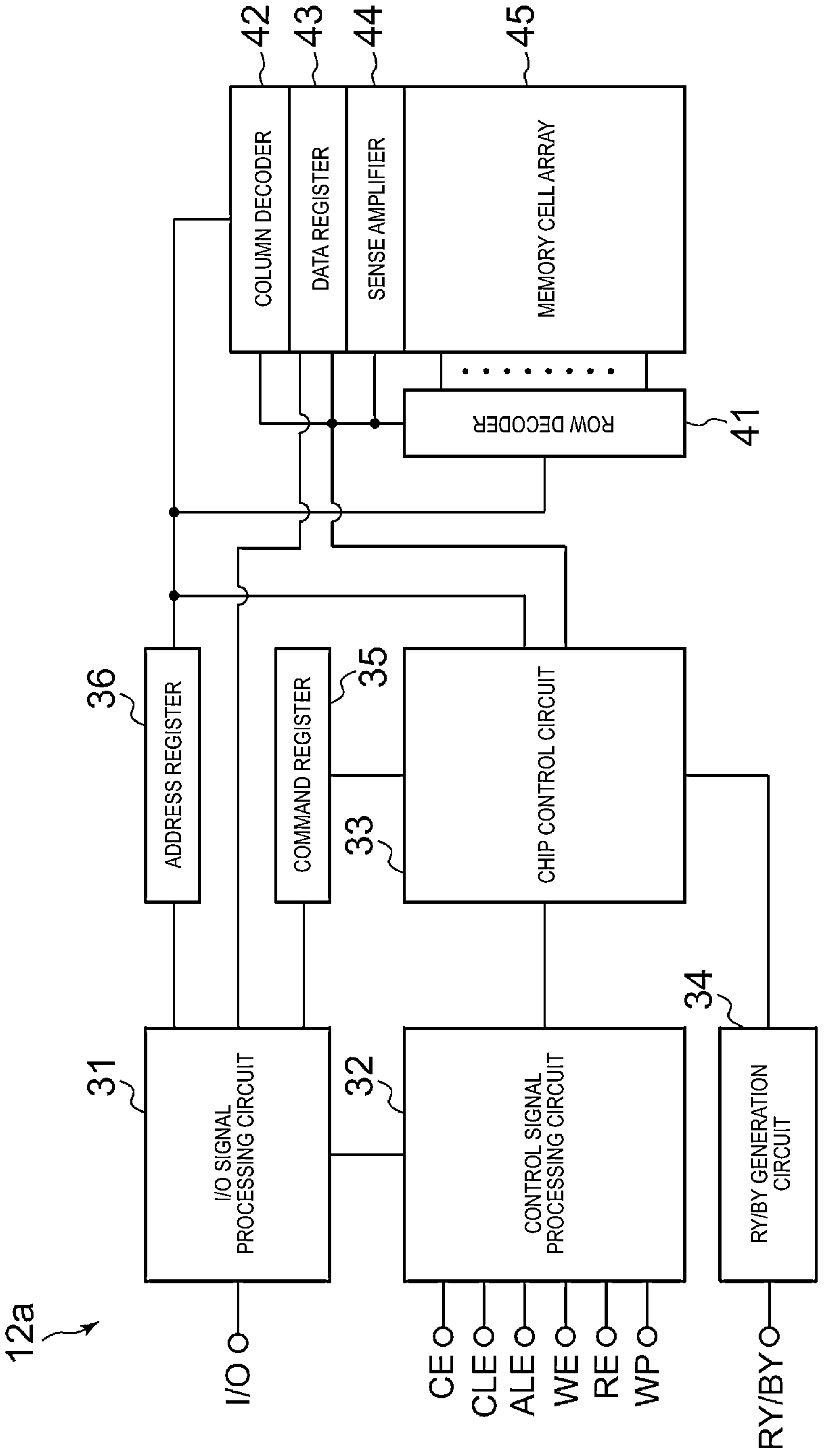
FIG. 2 is a block diagram showing a configuration of a memory unit: according to the first embodiment.

FIG. 2 is a block diagram showing a configuration of the memory unit 12*a* according to the first embodiment.

Each memory unit 12*a* according to the present embodiment includes an input/output (I/O) signal processing circuit 31, a control signal processing circuit 32, a chip control circuit 33, an RY/BY generation circuit 34, a command register 35, an address register 36, a row decoder 41, a column decoder 42, a data register 43, a sense amplifier 44, and a memory cell array 45.

The I/O signal processing circuit 31 processes an input signal that is input to the memory unit 12*a* and an output signal that is output from the memory unit 12*a*. The I/O signal processing circuit 31 functions as a buffer. A command, an address, and data latched by the I/O signal processing circuit 31 are distributed to the command register 35, the address register 36, and the data register 43, respectively.

The control signal processing circuit 32 processes a control signal that is input to the memory unit 12*a*. The control signal processing circuit 32 controls the distribution described above by the I/O signal processing circuit 31, based on the control signal to the memory unit 12*a*. The control signal input to the control signal processing circuit 32 includes, for example, a chip enable (CE) signal, a command latch enable (CLE) signal, an address latch enable (ALE) signal, a write enable (WE) signal, a read enable (RE) signal, or a write protest (WP) signal. The control signal processing circuit 32 also transfers the control signal to the chip control circuit 33.

The chip control circuit 33 controls the memory unit 12*a*. The chip control circuit 33 controls an operation of the memory unit 12*a*, based on the control signal transferred from the control signal processing circuit 32. An operation of the chip control circuit 33 is changed, for example, when a state of the chip control circuit 33 transitions according to the control signal.

The RY/BY generation circuit 34 outputs an RY (ready) signal and a BY (busy) signal. The RY/BY generation circuit 34 selectively outputs the RY signal and the BY signal under control of the chip control circuit 33. The RY signal is output when the memory unit 12*a* is not operating (ready state). The BY signal is output when the memory unit 12*a* is in operation (busy state).

The command register 35 is a circuit that stores a command. The command stored in the command register 35 is read by the chip control circuit 33.

The address register 36 is a circuit that stores an address. The address stored in the address register 36 is read by the chip control circuit 33, the row decoder 41, and the column decoder 42.

The row decoder 41 is a circuit that controls the voltage of the word line of the memory cell array 45. The row decoder 41 applies a voltage to the word line of the memory cell array 45, based on a row address read from the address register 36.

The column decoder 42 is a circuit that controls a latch circuit of the data register 43. The column decoder 42 selects the latch circuit of the data register 43, based on a column address read from the address register 36.

The data register 43 is a circuit that stores data. The data register 43 stores data from the I/O signal processing circuit 31 and data from the sense amplifier 44.

The sense amplifier 44 is a circuit that performs an operation related to the bit line of the memory cell array 45. The sense amplifier 44 senses data read to the bit line of the memory cell array 45. The row decoder 41, the column decoder 42, the data register 43, and the sense amplifier 44 function as interfaces for a read operation, a write operation, and an erasing operation for the memory cell array 45.

The memory cell array 45 is a region in which a plurality of memory cells are arranged in an array configuration. The memory cell array 45 is, for example, a three-dimensional memory in which memory cells are arranged in a three-dimensional array configuration. The memory cell array 45 functions as a memory region capable of storing data. More details of the memory cell array 45 will be described below.

Figure 3:
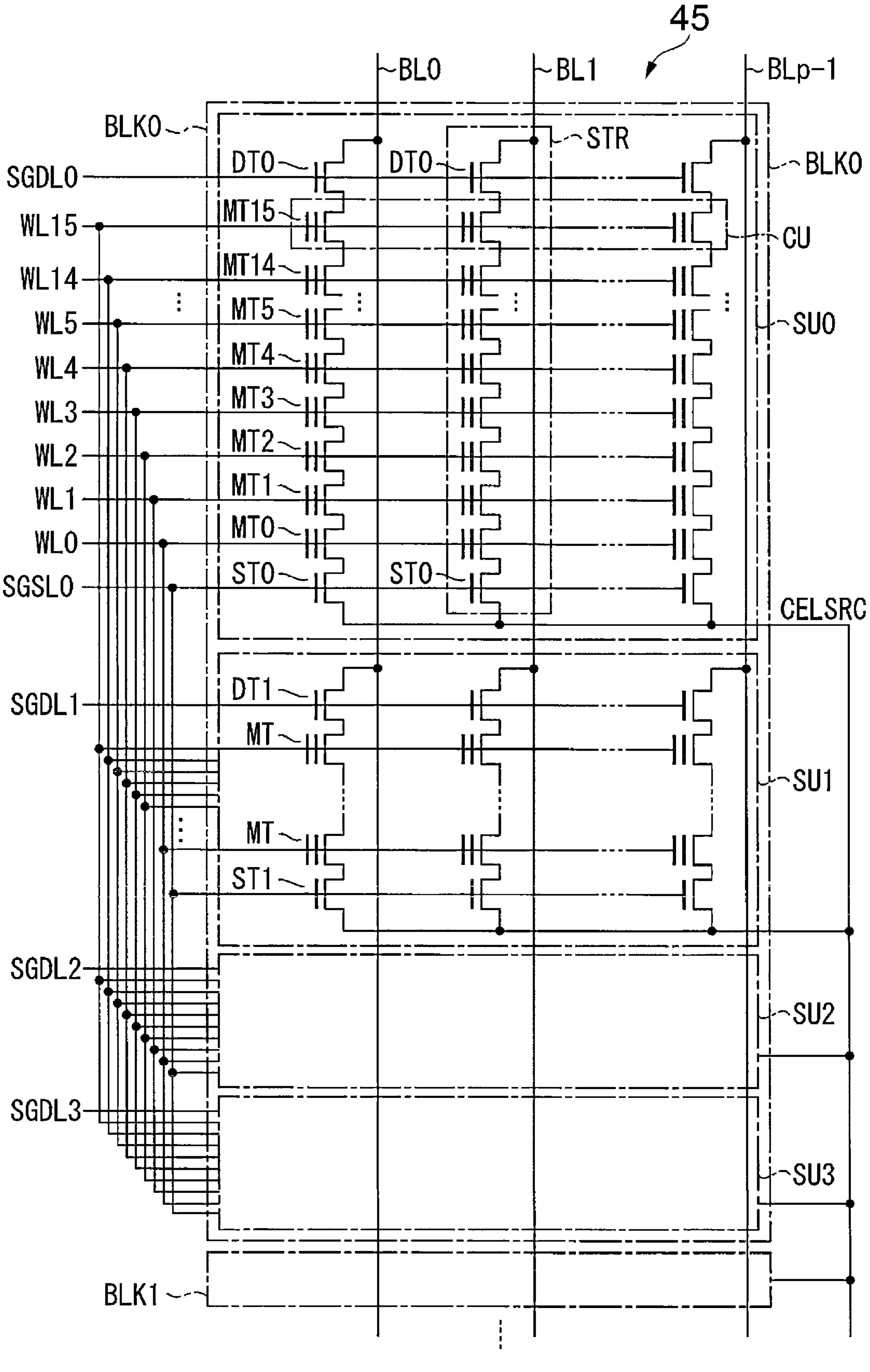
FIG. 3 is a circuit diagram showing a configuration of a memory cell array of the memory unit according to the first embodiment.

FIG. 3 is a circuit diagram a showing configuration of the memory cell array 45 according to the first embodiment.

The memory cell array 45 includes a plurality of blocks. FIG. 3 shows a block BLK0 and a block BLK1, as examples of the plurality of blocks. Hereinafter, the configuration of the block of the present embodiment will be described by using the block BLK0. The other blocks including the block BLK1 have the same configuration as the block BLK0.

The block BLK0 includes a plurality of string units SU0 to SU3. Each of the string units SU0 to SU3 includes p bit lines BL0 to BLp-1, a cell source line CELSRC, and p NAND strings STR (p is an integer of 2 or more). The NAND strings STR include memory cell transistors MT0 to MT15 on word lines WL0 to WL15, respectively. In addition, the NAND strings STR include the select transistors (select gates) ST0 and DT0 on the selection lines SGSL0 and SGDL0, respectively. The selection line SGSL0 is called a source-side selection line. The selection line SGDL0 is called a drain-side selection line. The other NAND strings STR also have the same structure.

Figure 4:
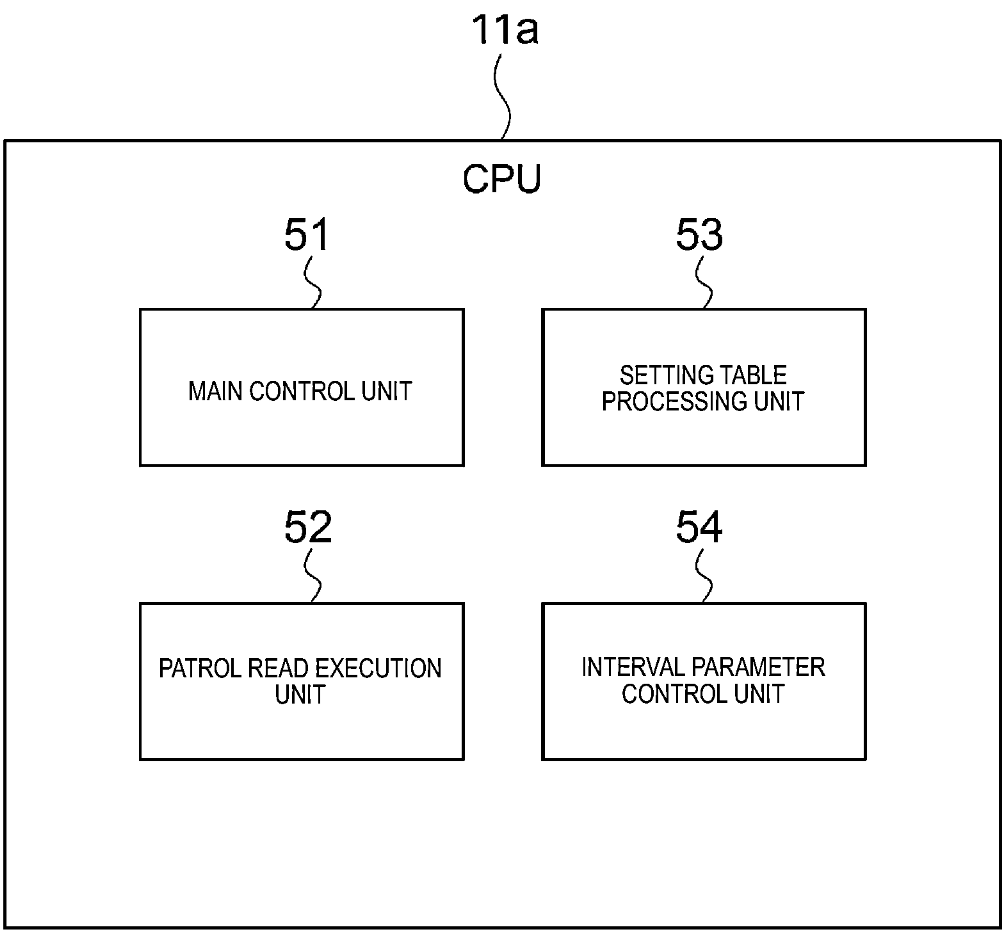
FIG. 4 is a block diagram showing a functional configuration of a CPU of a memory system according to the first embodiment.

FIG. 4 is a block diagram showing a functional configuration of the CPU 11*a* according to the first embodiment.

The CPU 11*a* includes a main control unit 51, a patrol read execution unit 52, a setting table processing unit 53, and an interval parameter control unit 54. For example, firmware stored in the ROM 11*c* is loaded in the RAM 11*b*, and executed by the CPU 11*a* to implement these functions. In addition, some of these functions may be implemented by dedicated hardware.

The main control unit 51 receives an instruction from the host device 2 and transmits an instruction to the memory 12. These instructions include, for example, a program instruction or a read instruction.

The patrol read execution unit 52 executes a patrol read process of the memory cell. The patrol read process is, for example, a data read process performed to ascertain a variation status s of a threshold voltage distribution of the written data. The patrol read execution unit (the number of error bits measurement unit) 52 measures the number of error bits included in the data read from the plurality of memory cells during the patrol read process. The patrol read execution unit 52 stores the measured number of error bits in the RAM 11*b*.

The setting table processing unit 53 refers to a parameter list 61 (to be described below) and converts the measured number of error bits into an adjustment amount of the write distribution interval. The write distribution interval is an interval between two adjacent threshold voltage distributions. The threshold voltage indicates a certain data storage state for the plurality of memory cells. An interval between two threshold voltage distributions corresponds to an interval between threshold voltage distributions in two different data storage states. The adjustment amount of the write distribution interval is an amount indicating a degree of change to an initial setting of the write distribution interval. The setting table processing unit 53 stores the adjustment amount of the converted write distribution interval in a setting table 62 (to be described below). The setting table processing unit (adjustment amount storage control unit) 53 is used to convert the measured number of error bits into the adjustment amount of the write distribution interval based on the parameter list 61, and stores the converted adjustment amount in the setting table 62. The setting table processing unit 53 stores the setting of a location where the write distribution interval needs to be adjusted in the setting table 62.

The interval parameter control unit (distribution interval control unit) 54 adjusts the write distribution interval in the threshold voltage distribution based on the measured number of error bits. More specifically, the interval parameter control unit 54 adjusts the write distribution interval based on the parameter list 61 and the measured number of error bits. The interval parameter control unit 54 sets the adjustment amount of the write distribution interval stored in the setting table 62 in the memory 12. In a specific implementation, the write distribution interval corresponding to a bit value is adjusted by adjusting a verify voltage used to verify programming of the bit value. For example, when the number of error bits for the bit value is large, the verify voltage is increased so that the write distribution interval is widened. In contrast, when the number of error bits for the bit value is small, the verify voltage is decreased so that the write distribution interval is narrowed. In a specific implementation, the adjustment amount of the verify voltage varies depending on the number of error bits. The write distribution interval is correlated with the reliability of the data stored in the memory cell array 45. The interval parameter control unit 54 sets a wider write distribution interval for a word line having a larger number of error bits. Thereby, the reliability of the stored data can be improved.

Figure 5:
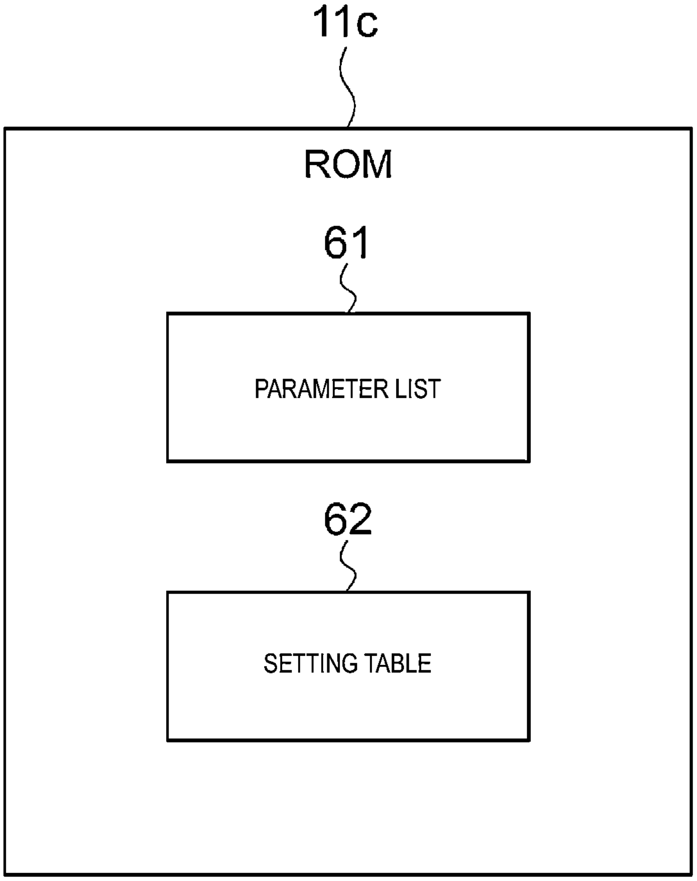
FIG. 5 is a block diagram showing contents stored in an ROM of the memory system according to the first embodiment.

FIG. 5 is a block diagram showing contents stored in the ROM 11*c* according to the first embodiment.

The ROM 11*c* stores the parameter list 61 and the setting table 62.

The parameter list 61 is information including a correspondence relation between the number of error bits and the adjustment amount of the write distribution interval. The parameter list 61 is previously set at least before the memory system 1 is operated.

The setting table 62 is information that specifies a location at which the write distribution interval is adjusted and an adjustment amount thereto. Items of the setting table 62 are stored by the setting table processing unit 53.

Figure 6:
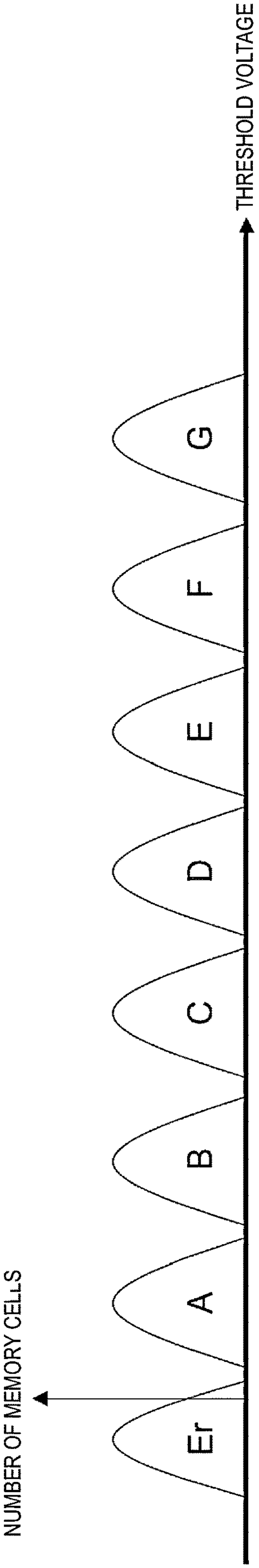
FIG. 6 is a diagram showing a threshold voltage distribution of memory cell transistors according to the first embodiment.

FIG. 6 is a diagram showing an example of a threshold voltage distribution of the memory cells according to the first embodiment. A vertical axis of FIG. 6 shows the number of memory cells indicating a certain bit value (data value). A horizontal axis of FIG. 6 shows threshold voltages of the memory cells. In FIG. 6, a plurality of threshold voltage distributions are shown not to overlap each other.

When the memory cell operates in a triple-level cell (TLC) mode, the threshold voltages of the memory cells form eight threshold voltage distributions. The eight threshold voltage distributions are respectively referred to, for example, as an Er state, an A state, a B state, a C state, a D state, an E state, an F state, and a G state in order of low threshold voltage. In the TLC mode, 3-bit data different from each other is assigned to each of the threshold voltage distributions of the Er state to the G state.

Figure 7:
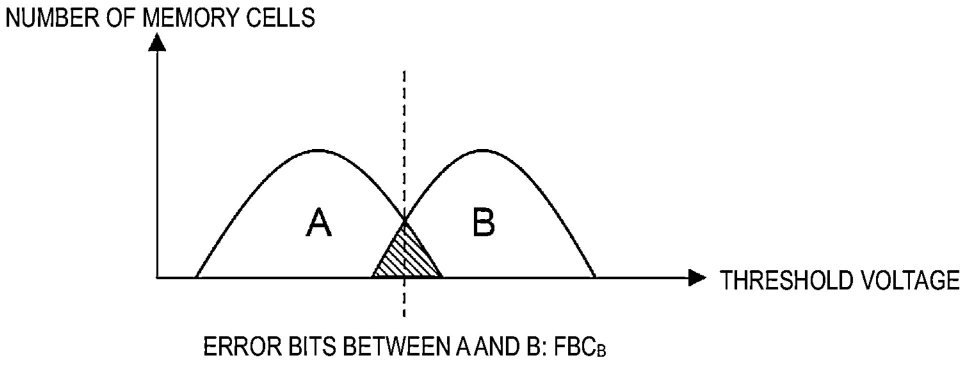
FIG. 7 is a diagram showing the number of error bits included in data read from memory cell transistors according to the first embodiment.

FIG. 7 is a diagram showing an example of the number of error bits of the memory cells according to the first embodiment. A vertical axis of FIG. 7 shows the number of memory cells indicating a certain bit value (data value). A horizontal axis of FIG. 7 shows threshold voltages of the memory cells. FIG. 7 shows a state in which the threshold voltage distribution in the A state and the threshold voltage distribution in the B state overlap each other.

The threshold voltage distribution may vary due to various factors and may overlap each other. The number of error bits is determined by the area of the hatched portion, which is an overlapping portion. Hereinafter, the number of error bits may be referred to as failed bit counts (FBC). The number of error bits between the A state and the B state is referred to as $FBC_B$. The number of error bits between a state X and a state Y having a threshold voltage distribution higher than the state X and adjacent to the threshold voltage distribution of the state X is referred to as $FBC_Y$. That is, the number of error bits between the Er state and the A state is referred to as $FBC_A$. The number of error bits between the B state and the C state is referred to as $FBC_C$. The number of error bits between the C state and the D state is referred to as $FBC_D$. The number of error bits between the D state and the E state is referred to as $FBC_E$. The number of error bits between the E state and the F state is referred to as $FBC_F$. The number of error bits between the F state and the G state is referred to as $FBC_G$.

Figure 8:
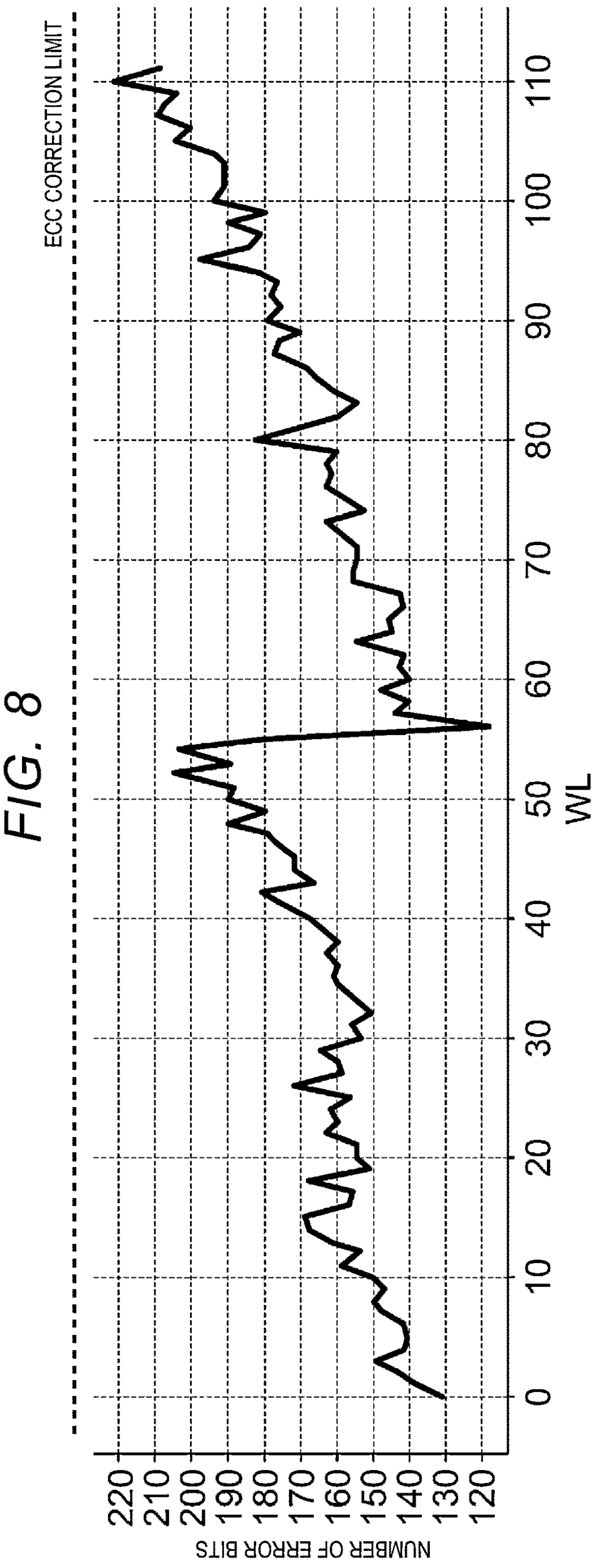
FIG. 8 is a graph showing the number of error bits of memory cell transistors for each word line according to the first embodiment.

FIG. 8 is a graph showing the number of error bits included in data read from the memory cells for each word line according to the first embodiment. A vertical axis of FIG. 8 shows a measurement result of an average value of the number of error bits. A horizontal axis of FIG. 8 shows a reference number of word lines (WL). An ECC correction limit is the number of error bits, which is the limit of correction process by the ECC circuit 11*d*. In the example shown in FIG. 8, the number of error bits does not exceed the ECC correction limit. Meanwhile, as shown in FIG. 8, the number of error bits varies for each word line.

Next, operation of storing in the setting table 62 by the memory system 1 will be described.

Figure 9:
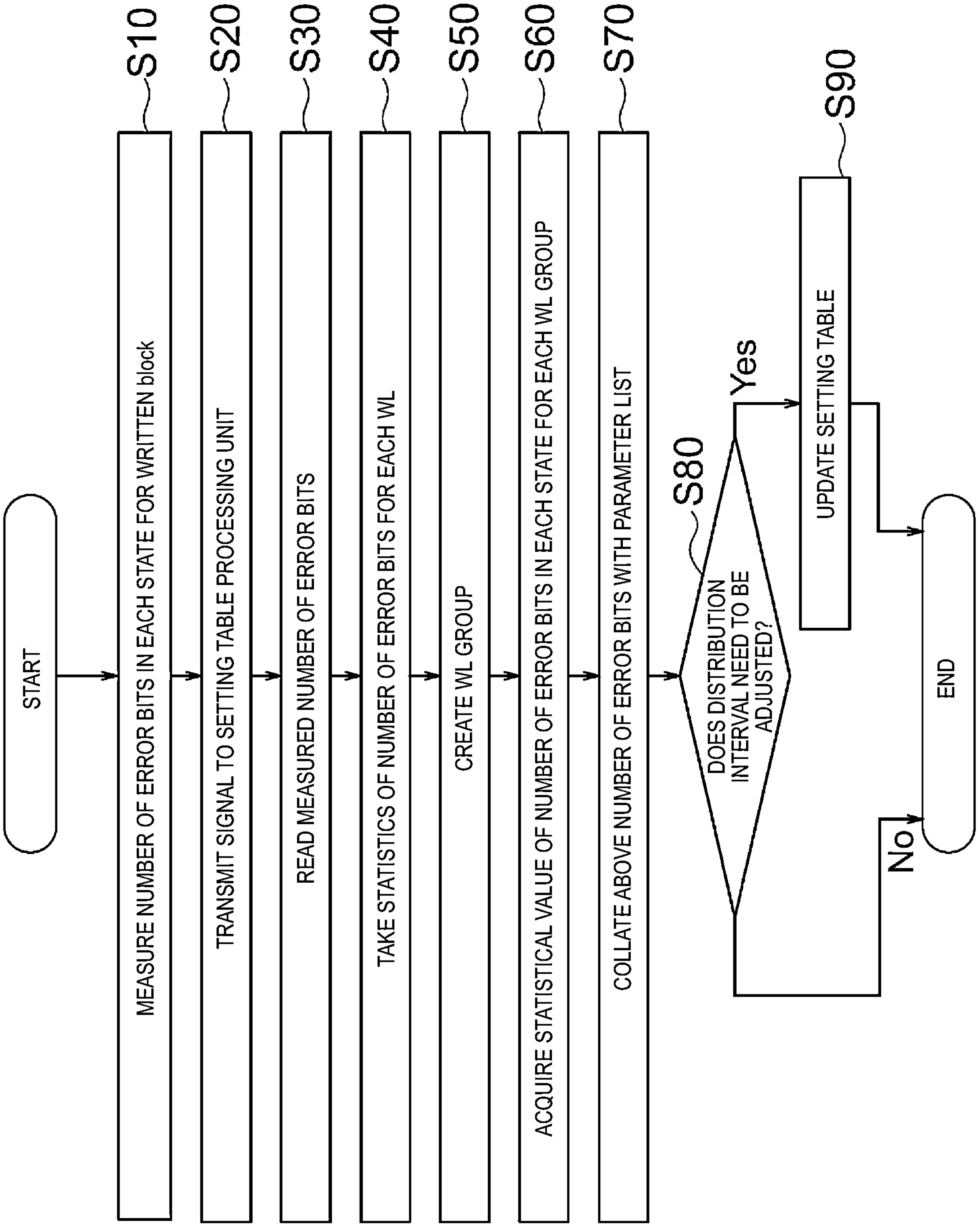
FIG. 9 is a flow chart of an operation performed by the memory system according to the first embodiment.

FIG. 9 is a flow chart of an operation performed by the memory system 1 according to the first embodiment. FIG. 9 shows the operation of storing in the setting table 62. In the first embodiment, the operation of storing in the setting table 62 is started (START) in response to the execution of the read process for a written block.

An example of the read process for the written block is the patrol read process by the patrol read execution unit 52. AS described above, the patrol read process is, for example, the data read process performed to ascertain the variation status of the threshold voltage distribution of the written data. The patrol read process may be performed at a timing of a certain period (for example, once a day). In addition, the patrol read process may be performed at a timing each time the program/erase count reaches a particular count (for example, 500 times). An execution frequency of the patrol read process is determined by taking into account the capacity of the memory 12 and the like. Another example of the read process for the written block is the read process based on the read request from the host device 2. The read process based on the read request from the host device 2 may be performed, for example, periodically.

The patrol read execution unit 52 measures the number of error bits with respect to each state (Er state to G state) for memory cells of the written block (S10). The patrol read execution unit 52 stores the measured number of error bits in the RAM 11*b*.

When the measured number of error bits is stored in the RAM 11*b*, the patrol read execution unit 52 transmits a signal to the setting table processing unit 53 (S20).

When the signal is received from the patrol read execution unit 52, the setting table processing unit 53 reads the measured number of error bits from the RAM 11*b* (S30).

The setting table processing unit 53 takes statistics of the read number of error bits for each word line (S40). The setting table processing unit 53 stores the statistical value of the number of error bits in the RAM 11*b*.

When the statistics of the number of error bits are taken for each word line, the setting table processing unit 53 creates a word line group including a plurality of word lines (S50). The word line group is a group including a plurality of word lines having values of the number of error bits close to each other. The word line group may be previously created. The word line group may also be created by a read process based on a read request from the host device 2.

The setting table processing unit 53 acquires the statistical value of the number of error bits with respect to each state (Er state to G state) from the RAM 11*b* for each created word line group (S60).

The setting table processing unit 53 collates the acquired statistical value of the number of error bits with the parameter list 61 (S70). The setting table processing unit 53 determines whether the write distribution interval needs to be adjusted (S80).

When the write distribution interval does not need to be adjusted (No in S80), the setting table processing unit 53 ends the series of processes in FIG. 9 (END).

When the write distribution interval needs to be adjusted (Yes in S80), the setting table processing unit 53 stores the adjustment amount of the write distribution interval, which is previously stored in the parameter list 61, in the setting table 62 (S90). After the process S90, the setting table processing unit 53 ends the series of processes in FIG. 9 (END).

FIG. 10 is a diagram showing an example of the content of the parameter list 61 according to the first embodiment.

FIG. 10 shows the measured number of error bits (bit/4 KB) and the adjustment amount Δ of the write distribution interval. The adjustment amount Δ is an amount of change with respect to a write distribution interval in an initial setting before adjustment of the write distribution interval. The fact that the adjustment amount Δ is positive indicates that the write distribution interval is widened with respect to the write distribution interval in the initial setting. The fact that the adjustment amount Δ is negative indicates that the write distribution interval is narrowed with respect to the write distribution interval in the initial setting. An adjustment amount $\Delta VCG_A$ indicates an adjustment amount of the write distribution interval between the Er state and the A state. Similarly, the adjustment amount $\Delta VCG_B$ indicates an adjustment amount of the write distribution interval between the A state and the B state. An adjustment amount $\Delta VCG_C$ indicates an adjustment amount of the write distribution interval between the B state and the C state. An adjustment amount $\Delta VCG_D$ indicates an adjustment amount of the write distribution interval between the C state and the D state. An adjustment amount $\Delta VCG_E$ indicates an adjustment amount of the write distribution interval between the D state and the E state. An adjustment amount $\Delta VCG_F$ indicates an adjustment amount of the write distribution interval between the E state and the F state. An adjustment amount $\Delta VCG_G$ indicates an adjustment amount of the write distribution interval between the F state and the G state.

FIG. 10 shows a set of "$FBC_A \geq 20$" and "$\Delta VCG_A = +0.01$". This indicates that the write distribution interval is increased by 0.01 when the number of error bits $FBC_A$ between the Er state and the A state is 20 bits or more.

FIG. 10 shows a set of "$FBC_A \geq 50$" and "$\Delta VCG_A = +0.02$". This indicates that the write distribution interval is increased by 0.02 when the number of error bits $FBC_A$ between the Er state and the A state is 50 bits or more.

FIG. 10 shows a set of "$FBC_A < 10$" and "$\Delta VCG_A = -0.01$". This indicates that the write distribution interval is reduced by 0.01 when the number of error bits $FBC_A$ between the Er state and the A state is less than 10 bits.

Figure 11:
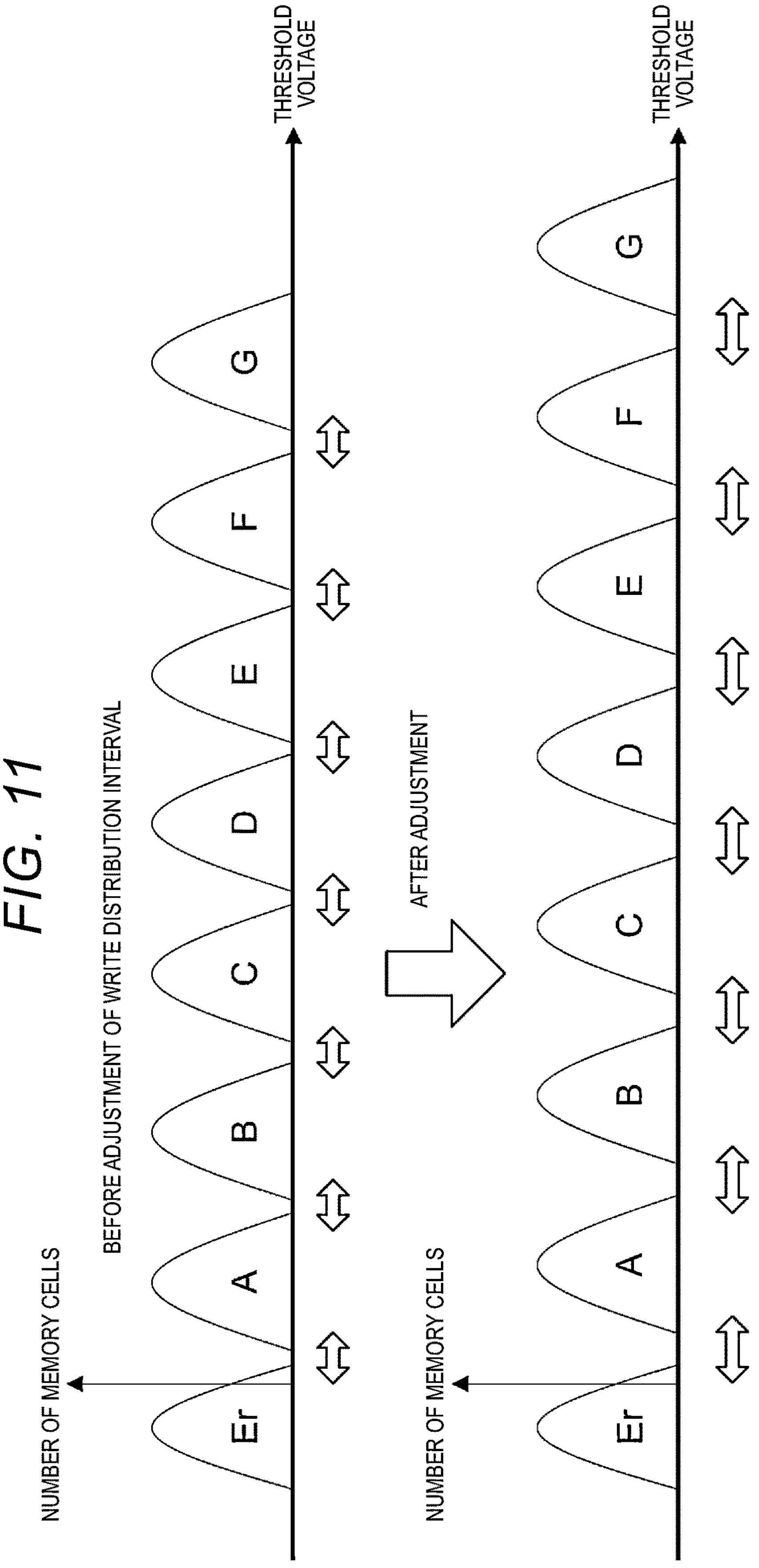
FIG. 11 is a diagram showing an example in which a write distribution interval between two threshold voltage distributions adjacent to each other is increased in the threshold voltage distributions in an Er state to a G state according to the first embodiment.

FIG. 11 is a diagram showing an example in which the write distribution interval between two threshold voltage distributions adjacent to each other in the threshold voltage distributions in the Er state to the G state is increased according to the first embodiment.

The memory system 1 may widen the interval of the threshold voltage distribution when the number of error bits is large.

Figure 12:
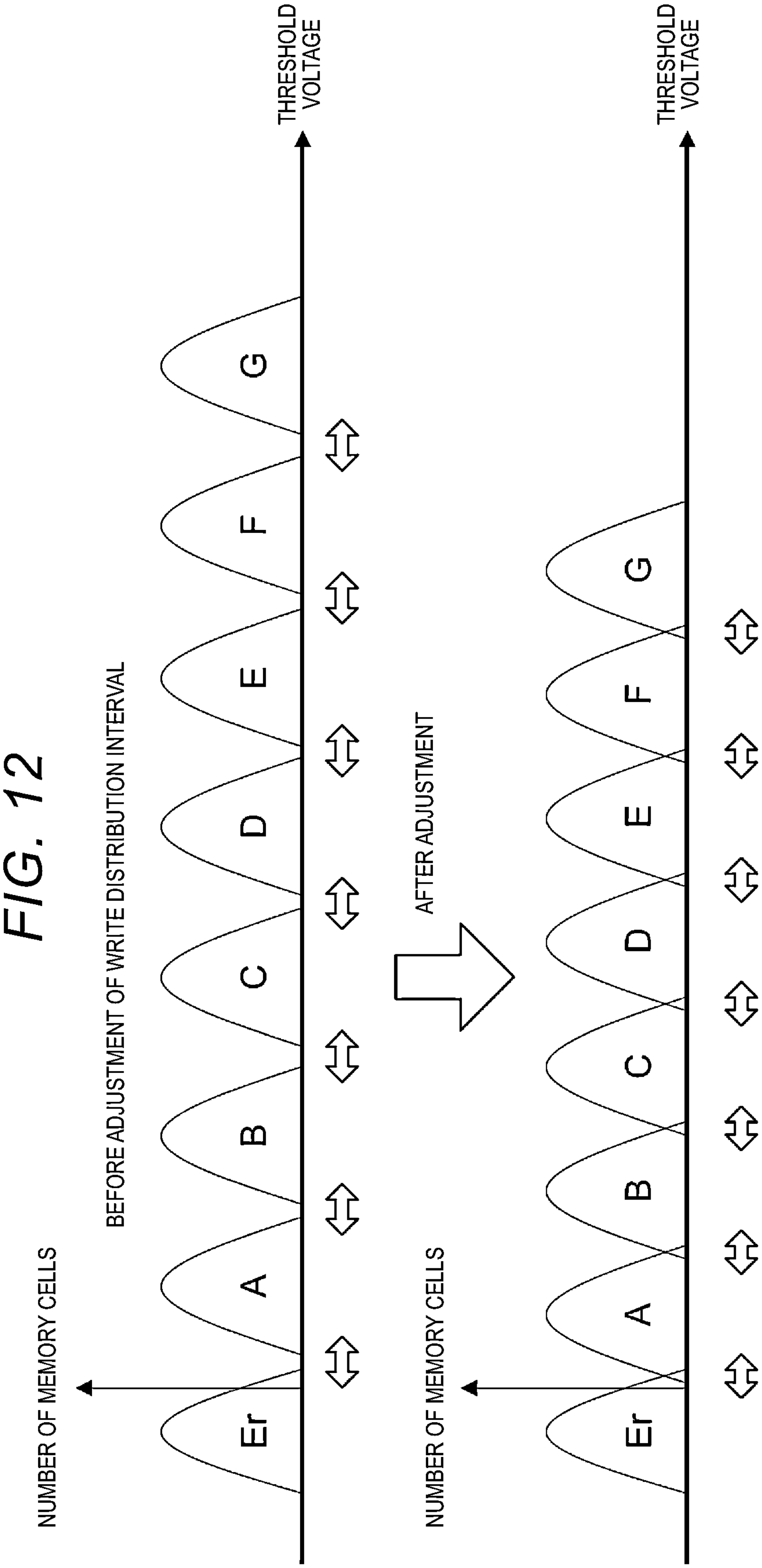
FIG. 12 is a diagram showing an example in which a write distribution interval between two threshold voltage distributions adjacent to each other is reduced in the threshold voltage distributions in the Er state to the G state according to the first embodiment.

FIG. 12 is a diagram showing an example in which the write distribution interval between two threshold voltage distributions adjacent to each other in the threshold voltage distributions in the Er state to the G state is reduced according to the first embodiment.

The memory system 1 may narrow the interval of the threshold voltage distribution when the number of error bits is small.

FIG. 13 is a diagram showing the content of the setting table 62 according to the first embodiment.

The setting table 62 indicates the position of the die, the block, the word line (WL), and the adjustment amount Δ of the write distribution interval for each state (Er state to G state). The die indicates a plurality of memory chips (memory units 12*a*) included in the memory 12. The position of the die is represented by specifying the parameters ch, ce, and lun. The symbol * in the block and the word line indicates don't care (any value). The adjustment amount Δ includes an adjustment amount $\Delta VCG_A$ to an adjustment amount $\Delta VCG_G$.

A first row of the setting table 62 shown in FIG. 13 indicates that the adjustment amount Δ is applied to the entire block "2010". A second row of the setting table 62 shown in FIG. 13 indicates that the adjustment amount Δ is applied to the word line groups "54 to 57" of the block "3673". A third row of the setting table 62 shown in FIG. 13 indicates that the adjustment amount Δ is applied to the entire die. A fourth row of the setting table 62 shown in FIG. 13 indicates that the adjustment amount Δ is applied to the word line groups "15 to 27".

Next, operation at the time of programming by the memory system 1 will be described.

Figure 14:
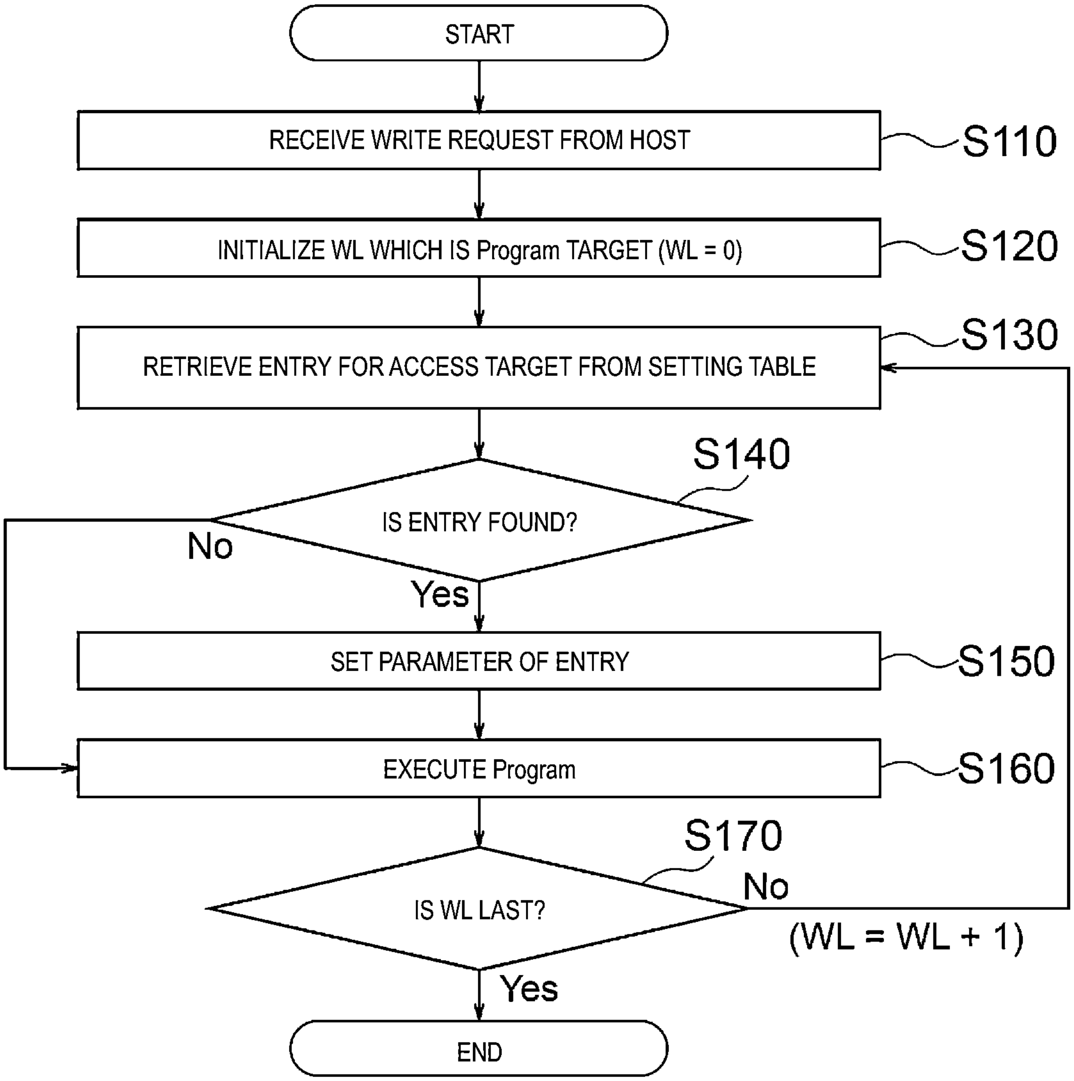
FIG. 14 is a flow chart of a write operation performed by the memory system according to the first embodiment.

FIG. 14 is a flow chart of a write operation performed by the memory system 1 according to the first embodiment.

When the main control unit 51 receives a write request from the host device 2 (S110), the main control unit 51 initializes a word line which is a program target (S120). The word line which is the program target after the initialization is the word line "0".

After an access target is set, the interval parameter control unit 54 retrieves an entry for the access target from the setting table 62 (S130). The entry indicates an item stored in the setting table 62.

When the entry of the access target is found (Yes in S140), the interval parameter control unit 54 sets the parameter of the adjustment amount Δ of the entry to the write distribution interval of a word line of the access target (S150). Setting the parameter of the adjustment amount Δ is to update the write distribution interval with the parameter. In a specific implementation, the write distribution interval is adjusted by adjusting a verify voltage of the corresponding bit value.

After the parameter of the adjustment amount Δ is set, the main control unit 51 executes a program (S160).

When the entry of the access target is not found (No in S140), process S160 is executed.

When the word line, which is the access target, is not the last word line (No in S170), the processes S130 to S160 are executed again with the next word line, which is obtained by incrementing the current word line by 1, as the access target.

When the word line, which is the access target, is the last word line (Yes in S170), the main control unit 51 and the interval parameter control unit 54 end the operation at the time of programming (END).

As shown in FIG. 14, the interval parameter control unit 54 controls the write distribution interval based on the adjustment amount of the write distribution interval stored in the setting table 62. The main control unit 51 executes the program of the plurality of memory cells at the controlled write distribution interval.

Next, operation at the time of reading by the memory system 1 will be described.

During the read operation, a read voltage Vth is corrected based on the adjustment amount Δ. The read voltage Vth is a voltage obtained by adding the adjustment amount Δ stored in the setting table 62 to the read voltage before correction.

Figure 15:
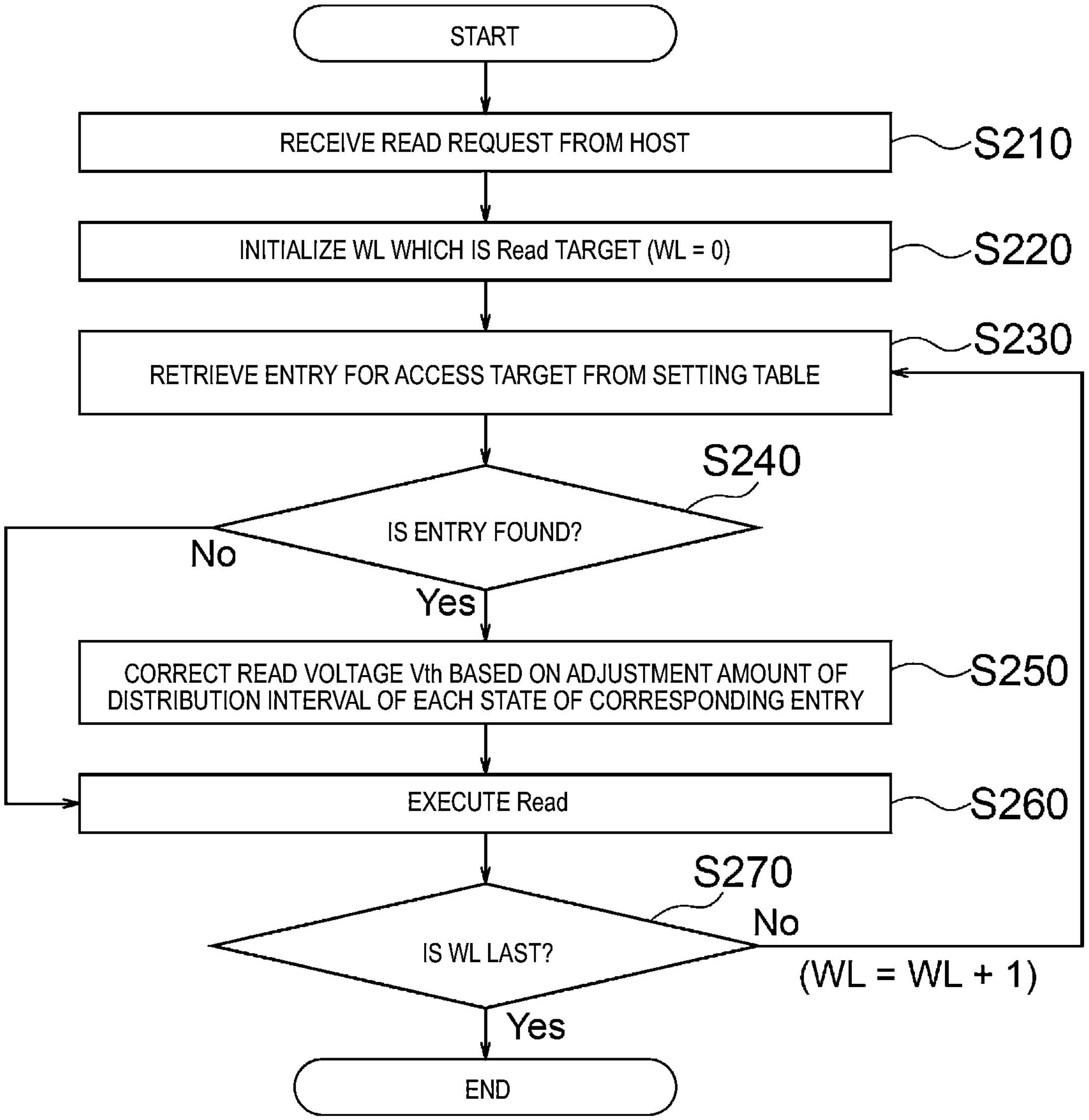
FIG. 15 is a flow chart of a read operation performed by the memory system according to the first embodiment.

FIG. 15 is a flow chart of a read operation performed by the memory system 1 according to the first embodiment. Here, an example in which data stored in a certain block is sequentially read from the word line 0 will be described.

When the main control unit 51 receives a read request from the host device 2 (S210), the main control unit 51 initializes the word line which is a read target (S220). The word line which is the read target after the initialization is the word line "0".

After the access target is set, the interval parameter control unit 54 retrieves an entry for the access target from the setting table 62 (S230).

When the entry of the access target is found (Yes in S240), the interval parameter control unit 54 corrects the read voltage Vth of the word line, which is the access target, based on the adjustment amount Δ of each state (Er state to G state) of the entry (S250).

After that, the main control unit 51 executes the read (S260).

When the entry of the access target is not found (No in S240), process S260 is executed.

When the word line, which is the access target, is not the last word line (No in S270), the processes S230 to S260 are executed again with the next word line, which is obtained by incrementing the current word line by 1, as the access target.

When the word line, which is the access target, is the last word line (Yes in S270), the main control unit 51 and the interval parameter control unit 54 end the operation at the time of reading (END).

As described above, according to the first embodiment, the patrol read execution unit 52 measures the number of error bits of the memory cells. The interval parameter control unit 54 controls the write distribution interval in the threshold voltage distribution of the memory cells based on the measured number of error bits. Thereby, the write distribution interval may be adjusted according to the quality variation of the memory 12. In addition, the memory system 1 according to the first embodiment can optimize the write distribution interval for each word line. For example, a stress resistance can be improved by widening the write distribution interval between the write distribution intervals on the word lines having relatively low quality. As a result, the reliability can be improved. In addition, power consumption can be further reduced by narrowing the write distribution voltage on the word line having relatively high reliability.

By creating a word line group, a plurality of word lines can be collectively managed. As a result, a required memory capacity and a time required for data reference may be reduced. As a modification example, the word line group may not be created, and the word lines may be managed one by one.

The interval parameter control unit 54 may refer to the parameter list 61 after the patrol read process and immediately set the adjustment amount Δ and the read voltage Vth in the memory 12. Thereby, the adjustment is immediately performed when an appropriate adjustment amount Δ and a read voltage Vth are found. In this case, the setting table 62 is not used.

Second Embodiment

Figure 16:
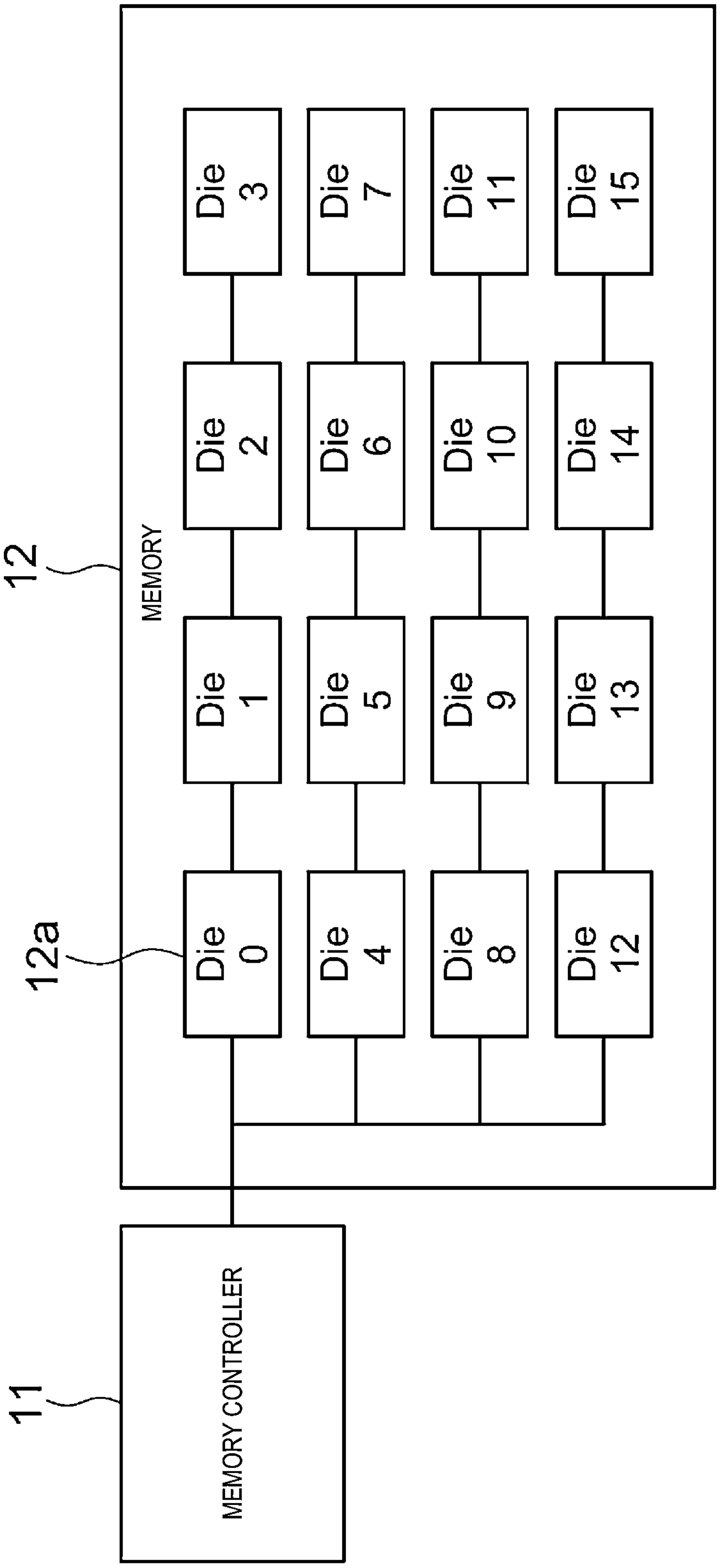
FIG. 16 is a block diagram showing a configuration of a memory unit according to a second embodiment.

FIG. 16 is a block diagram showing a configuration of a memory 12 according second embodiment. The second embodiment is different from the first embodiment in that the write distribution interval is adjusted for each die in accordance with the quality variation of the die.

As shown in FIG. 16, a plurality of dies are connected in a row.

Figure 17:
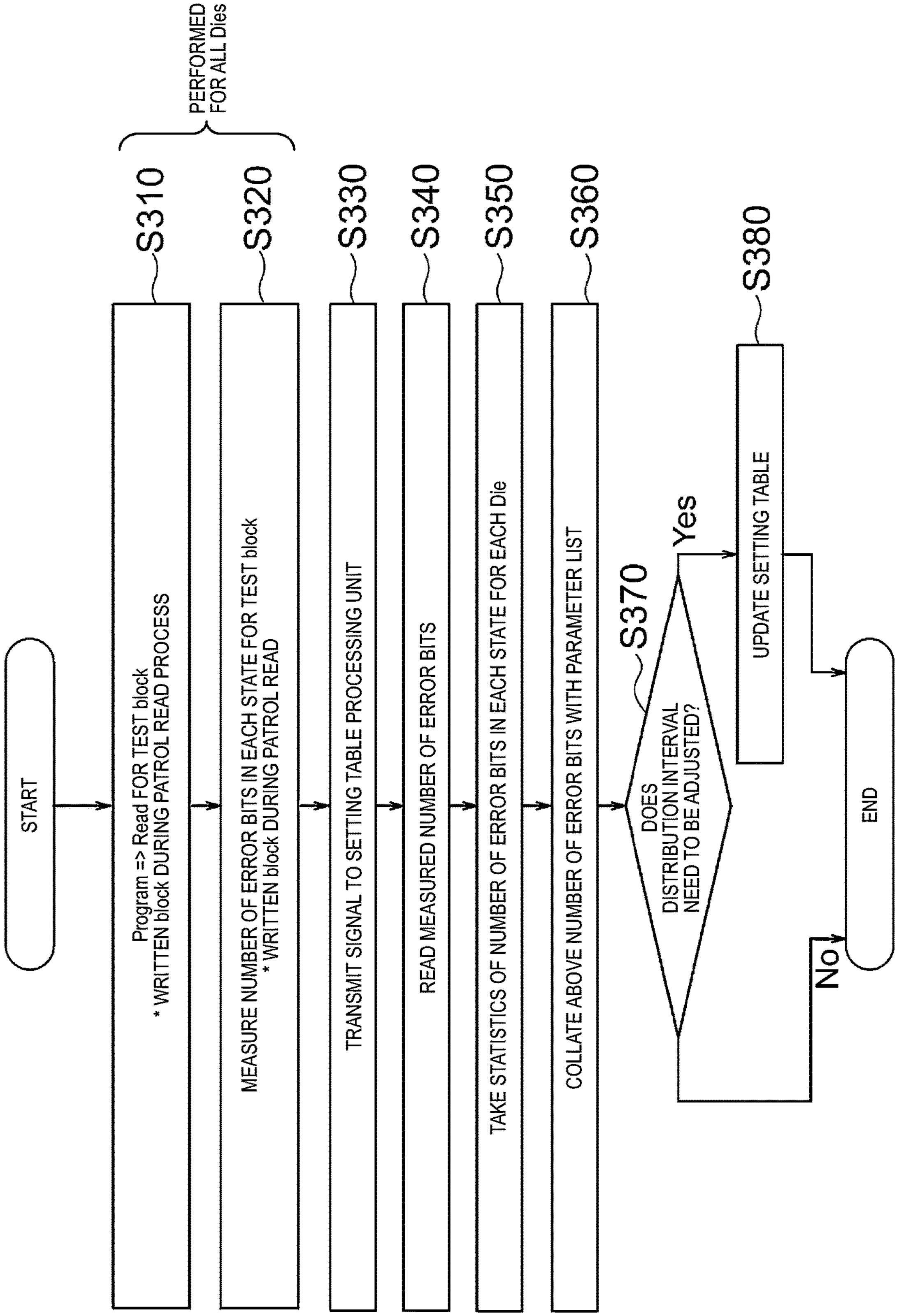
FIG. 17 is a flow chart of an operation performed by a memory according to the second embodiment.

FIG. 17 is a flow chart of an operation performed by a memory system 1 according to the second embodiment. FIG. 17 shows the operation of storing in the setting table 62. In the second embodiment, the operation of storing in the setting table 62 is started at any timing while the memory system 1 is operating (START).

The main control unit 51 performs a program and a read for a test block (S310). The test block is a block in which reading and writing are performed experimentally for checking the quality of the die.

After the program and the read are performed for the test block, the main control unit 51 measures the number of error bits in each state (Er state to G state) for the test block (S320). The measured number of error bits is stored in the RAM 11*b*.

The processes S310 and S320 are performed for all the dies of the test block.

In the processes S310 and S320, the same process as the process S10 shown in FIG. 9 may be performed during the patrol read process as a modification example. In the processes S310 and S320 in which the patrol read process is performed, the test block is not used, and any written block is used.

The main control unit 51 or the patrol read execution unit 52 transmits a signal to the setting table processing unit 53 when the measured number of error bits is stored in the RAM 11*b* (S330).

When the signal is received from the main control unit 51 or the patrol read execution unit 52, the setting table processing unit 53 reads the measured number of error bits from the RAM 11*b* (S340).

The setting table processing unit 53 takes statistics of the read number of error bits in each state for each die (S350). By taking the statistics of the number of error bits, the number of worst error bits in each state for each die is obtained.

The setting table processing unit 53 collates the number of worst error bits in each state with the parameter list 61 (S360). The setting table processing unit 53 determines whether the write distribution interval needs to be adjusted (S370). The process after the process S370 is the same as the process after the process S80 shown in FIG. 9.

FIG. 18 is a diagram showing the content of the setting table 62 according to the second embodiment.

FIG. 18 shows the adjustment amount Δ of the write distribution interval for each state with respect to two dies, the die "0" and the die "1", shown in FIG. 16.

Next, operation at the time of programming by the memory system 1 will be described.

Figure 19:
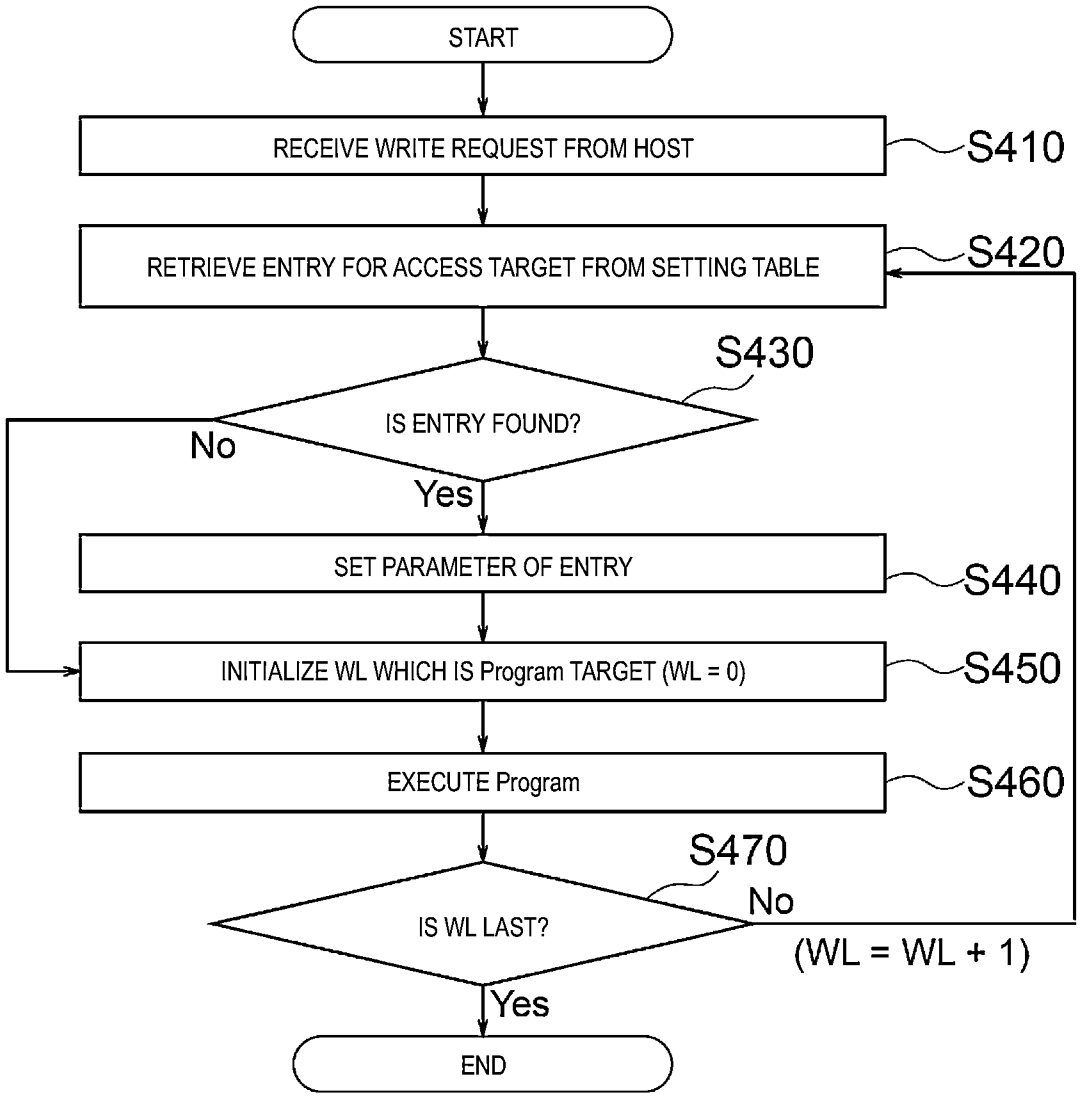
FIG. 19 is a flow chart of a write operation performed by the memory system according to the second embodiment.

FIG. 19 is a flow chart of a write operation performed by the memory system 1 according to the second embodiment.

When the main control unit 51 receives a write request from the host device 2 (S410), the interval parameter control unit 54 retrieves an entry for the access target from the setting table 62 (S420).

When the entry of the access target is found (Yes in S430), the interval parameter control unit 54 sets the parameter of the adjustment amount Δ of the entry to the write distribution interval of a die of the access target (S440).

After the parameter of the adjustment amount Δ is set, the main control unit 51 initializes the word line which is a program target (S450). Here, the word line which is the program target is, for example, the word line "0".

When the entry of the access target is not found (No in S430), process S450 is executed.

After the word line is initialized, the main control unit 51 executes a program (S460).

When the word line, which is the access target, is not the last word line (No in S470), the processes S420 to S460 are executed again with the next word line, which is obtained by incrementing the current word line by 1, as the access target.

When the word line, which is the access target, is the last word line (Yes in S470), the main control unit 51 and the interval parameter control unit 54 end the operation at the time of programming (END).

Next, operation at the time of reading by the memory system 1 will be described.

Figure 20:
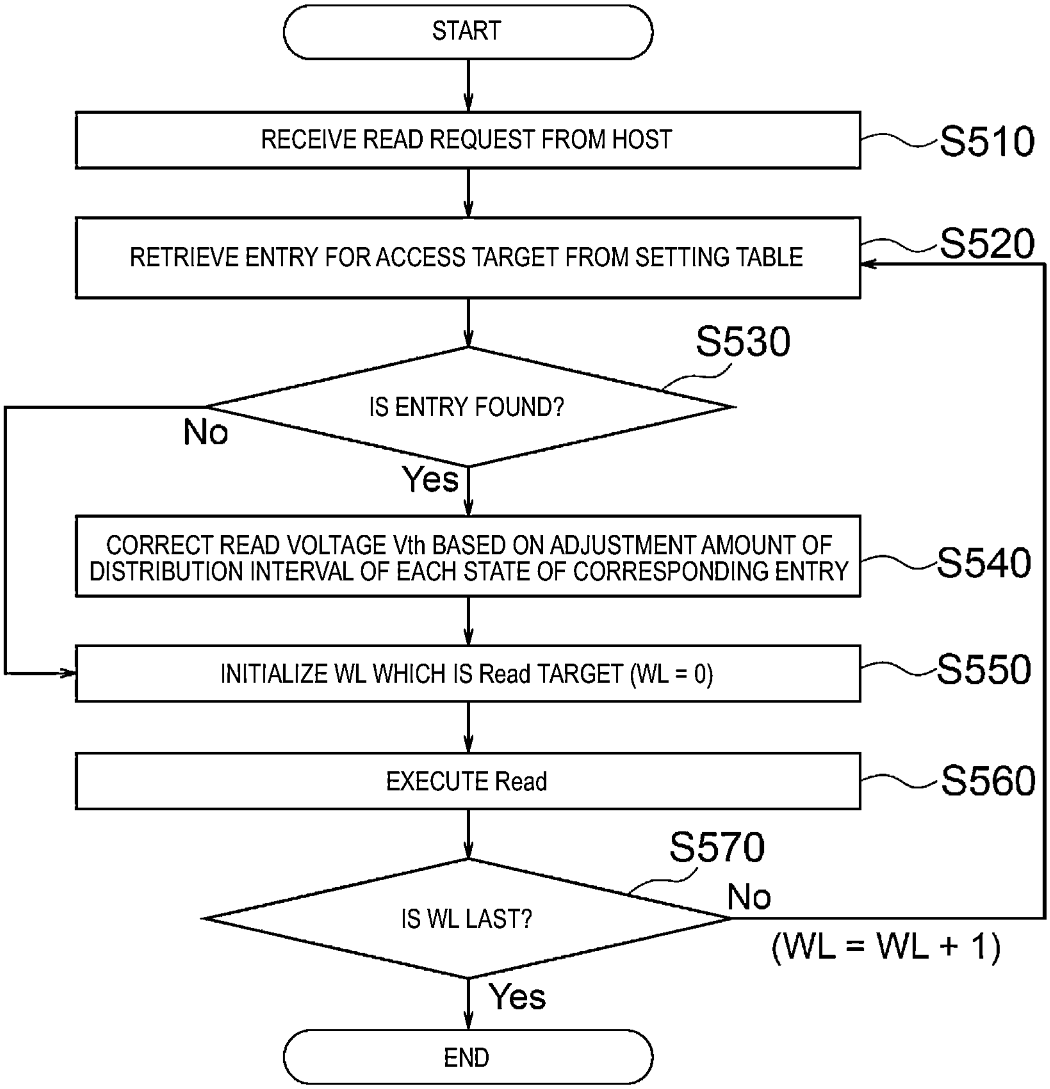
FIG. 20 is a flow chart of a read operation performed by the memory system according to the second embodiment.

FIG. 20 is a flow chart of a read operation performed by the memory system 1 according to the second embodiment. Here, an example in which data stored in a certain block is sequentially read from the word line 0 will be described.

When the main control unit 51 receives a read request from the host device 2 (S510), the interval parameter control unit 54 retrieves an entry for the access target from the setting table 62 (S520).

When the entry of the access target is found (Yes in S530), the interval parameter control unit 54 corrects the read voltage Vth of the word line, which is the access target, based on the adjustment amount Δ of each state of the entry (S540).

After that, the main control unit 51 initializes the word line which is a read target (S550). Here, the word line which is the read target is the word line "0".

When the entry of the access target is not found (No in S530), process S560 is executed.

After the word line is initialized, the main control unit 51 executes the read (S560).

When the word line, which is the access target, is not the last word line (No in S570), the processes S520 to S560 are executed again with the next word line, which is obtained by incrementing the current word line by 1, as the access target.

When the word line, which is the access target, is the last word line (Yes in S570), the main control unit 51 and the interval parameter control unit 54 end the operation at the time of reading (END).

According to the second embodiment, the write distribution interval can be optimized for each die.

As in the second embodiment, the write distribution interval may be adjusted for each die in accordance with the quality variation of the die. The memory system 1 of the second embodiment can obtain the same effects as those of the first embodiment.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
a memory device including a plurality of memory cell transistors; and
a memory controller configured to:
write data to each of the plurality of memory cell transistors, the data having one of a plurality of bit values;
read the data from the plurality of memory cell transistors, and measure a number of errors included in the read data with respect to two of the bit values of which corresponding threshold voltage distributions are adjacent to each other; and
adjust a difference between the threshold voltage distributions corresponding to the two of the bit values based on the measured number of errors.

2. The memory system according to claim 1, wherein the memory controller is configured to:
adjust the difference between the threshold voltage distributions to a first amount when the measured number of errors is a first number; and
adjust the difference between the threshold voltage distributions to a second amount greater than the first amount when the measured number of errors is a second number greater than the first number.

3. The memory system according to claim 1, wherein the memory controller is configured to adjust the difference between the threshold voltage distributions based on the measured number of errors, with reference to a predetermined relationship between numbers of errors and differences between adjacent two threshold voltage distributions.

4. The memory system according to claim 1, wherein the memory controller is configured to:
store the adjusted difference in a memory; and
write data to the plurality of memory cell transistors using a verify voltage of which value is adjusted in accordance with the adjusted difference stored in the memory.

5. The memory system according to claim 1, wherein the memory controller is configured to:
adjust a read voltage corresponding to the two of the bit values based on the adjusted difference between the threshold voltage distributions.

6. The memory system according to claim 5, wherein the memory controller is configured to:
adjust the read voltage corresponding to the two of the bit values to be a first value when the adjusted difference between the threshold voltage distributions is a first amount; and
adjust the read voltage corresponding to the two of the bit values to be a second value greater than the first value when the adjusted difference between the threshold voltage distributions is a second amount greater than the first amount.

7. The memory system according to claim 1, wherein the memory controller is configured to:
write multi-bit data to each of the plurality of memory cell transistors, the multi-bit data having one of a plurality of multi-bit values;
read the multi-bit data from the plurality of memory cell transistors;
with respect to each of different combinations of two of the multi-bit values of which corresponding threshold voltage distributions are adjacent to each other, measure a number of errors included in the multi-bit data read from the plurality of memory cell transistors; and
adjust a difference between adjacent threshold voltage distributions corresponding to each of the different combinations of two of the multi-bit values based on the measured numbers of errors.

8. The memory system according to claim 1, wherein
the plurality of memory cell transistors is grouped in units of particular segments, and
the memory controller is configured to measure the number of errors and adjust the difference between the threshold voltage distributions, with respect to each of the particular segments.

9. The memory system according to claim 8, wherein the particular segments corresponds to memory dies, blocks in one memory die, or word lines in one memory die.

10. The memory system according to claim 1, wherein
the plurality of memory cell transistors is grouped in units of word lines, and
the memory controller is configured to:
measure the number of errors with respect to each of the word lines;
group the word lines into a plurality of word line groups based on the measured numbers of errors; and
adjust the difference between the threshold voltage distributions with respect to each of the word line groups.

11. The memory system according to claim 10, wherein
the plurality of word line groups includes a first word line group corresponding to a first level of errors and a second word line group corresponding to a second level of errors different from the first level, and
the memory controller is configured to:
adjust the difference between the threshold voltage distributions to a first amount for the first word line group; and
adjust the difference between threshold voltage distributions to a second amount different from the first amount for the second word line group.

12. The memory system according to claim 1, wherein the memory controller is configured to periodically perform a read operation to measure the number of errors.

13. A control method of a memory device having a plurality of memory cell transistors, the control method comprising:
writing data to each of the plurality of memory cell transistors, the data having one of a plurality of bit values;
reading the data from the plurality of memory cell transistors, and measuring a number of errors included in the read data with respect to two of the bit values of which corresponding threshold voltage distributions are adjacent to each other; and
adjusting a difference between the threshold voltage distributions corresponding to the two of the bit values based on the measured number of errors.

14. The control method according to claim 13, wherein said adjusting the difference comprises:
adjusting the difference between the threshold voltage distributions to a first amount when the measured number of errors is a first number; and
adjusting the difference between the threshold voltage distributions to a second amount greater than the first amount when the measured number of errors is a second number greater than the first number.

15. The control method according to claim 13, wherein said adjusting the difference comprises:

adjusting the difference between the threshold voltage distributions based on the measured number of errors with reference to a predetermined relationship between numbers of errors and differences between two write voltages.

16. The control method according to claim 13, further comprising:

storing the adjusted difference in a memory; and writing data to the plurality y of memory cell transistors using a verify voltage of which value is adjusted in accordance with the adjusted difference stored in the memory.

17. The control method according to claim 13, wherein further comprising:

adjusting a read voltage corresponding to the two of the bit values based on the adjusted difference between the threshold voltage distributions.

18. The control method according to claim 13, wherein said writing comprises writing multi-bit data to each of the plurality of memory cell transistors, the multi-bit data having one of a plurality of multi-bit values, said reading comprises reading the multi-bit data from the plurality of memory cell transistors, and the method further comprises:

with respect to each of different combinations of two of the multi-bit values of which corresponding threshold voltage distributions are adjacent to each other, measuring a number of errors included in the multi-bit data read from the plurality of memory cell transistors; and adjusting a difference between adjacent threshold voltage distributions corresponding to each of the different combinations of two of the multi-bit values based on the measured numbers of errors.

19. The control method according to claim 13, wherein the plurality of memory cell transistors is grouped in units of particular segments, and said measuring the number of errors and said adjusting the difference between the threshold voltage distributions are carried out with respect to each of the particular segments.

20. The control method according to claim 13, further comprising periodically performing a read operation to measure the number of errors.

* * * * *